United States Patent [19]

Bunshah et al.

[11] Patent Number: 5,698,328
[45] Date of Patent: Dec. 16, 1997

[54] DIAMOND THIN FILM ELECTRON EMITTER

[75] Inventors: Rointan F. Bunshah, Playa del Rey; Shyankay R. Jou, Santa Monica; Hans J. Doerr, Westlake Village, all of Calif.

[73] Assignee: The Regents of the University of California, Oakland, Calif.

[21] Appl. No.: 426,223

[22] Filed: Apr. 21, 1995

Related U.S. Application Data

[63] Continuation-in-part of Ser. No. 223,693, Apr. 6, 1994, abandoned.

[51] Int. Cl.$^6$ .................................................. C01B 31/06
[52] U.S. Cl. ................. 428/408; 423/446; 156/DIG. 68
[58] Field of Search ........................ 428/408, 704; 423/446

[56] References Cited

U.S. PATENT DOCUMENTS

| | | | |
|---|---|---|---|
| 4,740,263 | 4/1988 | Imai et al. | 156/613 |
| 5,180,951 | 1/1993 | Dworsky et al. | 315/169.3 |
| 5,221,411 | 6/1993 | Narayan | 156/603 |
| 5,243,170 | 9/1993 | Maruyama et al. | 219/121.59 |
| 5,374,318 | 12/1994 | Rabalais et al. | 148/33 |
| 5,430,348 | 7/1995 | Kane et al. | 313/309 |

FOREIGN PATENT DOCUMENTS

| | | |
|---|---|---|
| 0 706 196 A2 | 4/1996 | European Pat. Off. |
| WO 95/22168 | 8/1995 | WIPO |
| WO 95/22169 | 8/1995 | WIPO |

OTHER PUBLICATIONS

Wang, C. et al, "Cold Field Emission From CVD Diamond Films Observed in Emissionn Electron Microscopy," *Electronics Letters*, vol. 27, Nr. 16, pp. 1459-1461, (1 Aug. 1991).

Kumar, N. et al., "6-1: Development of Nano-Crystalline Diamond-Based Field-Emission Displays,", *SID International Symposium Digest of Technical Papers*, San Jose, vol. 25, pp. 43-46, (14 Jun. 1994).

*Patent Abstracts of Japan*, vol. 95, No. 005 & JP,A,07 130981 (Canon Inc.), 19 May 1995.

*Primary Examiner*—Archene Turner
*Attorney, Agent, or Firm*—Michael J. Ram; Marvin H. Kleinberg; Marshall A. Lerner

[57] ABSTRACT

Doped and undoped polycrystalline and noncrystalline diamond films produced by plasma enhanced chemical transport emit electrons into a vacuum in response to an applied electrical field. The field required to create emission is less than 20 V/μm for doped polycrystalline films, can be in the range of 5 to 8 volts/μm for undoped nanocrystalline films and may be 3 volts/μm or less for doped nanocrystalline films. These materials exhibit emission properties which are continuous across the whole surface of the film.

10 Claims, 10 Drawing Sheets

(2 of 15 Drawing(s) in Color)

DIAMOND THIN FILM ELECTRON EMITTER

BACKGROUND

This application is a continuation in part to U.S. application Ser. No. 08/223,693 filed Apr. 6, 1994 now abandoned.

The present invention relates to doped and undoped microcrystalline diamond films which exhibit field emission properties. In particular, the invention relates to thin films having a cauliflower-like (nanocrystalline) morphology or polycrystalline (microcrystalline) morphology which is particularly suitable for emitting electrons into a vacuum in response to an electrical driving force. More particularly, the invention relates to electron emitting devices using diamond films as electron sources to be used in conjunction with electron activated display screens.

Operation of electron tubes and field emission displays (FEDs) rely on the emission of electrons from solid surfaces into a vacuum. Four mechanisms which generate electron emissions are 1) thermionic emission, 2) field electron emission, 3) thermionic field emissions and 4) secondary electron emission. In each mechanism, to release electrons from a surface into a vacuum a certain amount of energy, referred to as the work function $e\phi$, must be provided to the surface. In thermionic emission the energy is supplied in the form of heat, in field electron emission the energy is supplied by an electrical field and in secondary emission the energy is supplied by particle bombardment. Thermionic field emission utilizes a combination of heat and an electrical field. The present invention relates primarily to field electron emission (i.e., room temperature, electric field generated emission).

Carbon exists in two different natural crystallographic states, as well as two intermediate amorphous forms. Graphite is a soft material (hardness=12 HV) having a hexagonal crystal structure, a significant anisotropy and a density of 2.6 g/cm$^2$. The intermediate carbon materials, referred to as "amorphous" and "amorphic carbon", have diamond-like properties but lack a long-range ordered structure or include islands of sp$^2$-bonded (hexagonal) carbon linked by disordered diamond-type sp$^3$-bonds. On the other hand, diamond, has a density of 3.5 g/cm3 and a cubic structure, described as a tetrahedral coordination of C(sp$^3$) atoms.

The scientific principles relating to negative electron affinity of semiconductor materials is discussed by Bell (R. L. Bell *Negative Electron Affinity Devices*, (Clarendon Press, Oxford, 1973)). Once electrons are excited into the conduction band they flow into the vacuum. The energy necessary to excite the electrons to the conduction band (the potential barrier of height $\chi$) is dependant on the chemical makeup of the material and its surface characteristics. In semiconductor materials of technical importance (Si, GaAs, InAs) the potential barrier has a height $\chi$ in the order of about 4 to 5 eV. This is historically reduced by applying a coating of cesium or cesium oxide to the surface of the semiconductor or by band bending near the surface depletion region of the p-type Natural diamond, particularly type IIb diamond, has a suitable negative electron affinity (NEA) on its {111} surface (M. N. Yodar, "Diamond: Its Impact on Electronics," *Naval Research Review*, Vol. XLIV, Three/1992,pp. 17–20; F. J. Himpsel, J. a. Knapp, J. A. VanVechten and D. E. Eastman, "Quantum Photo Yield of Diamond (111)-A Stable Negative-Affinity Emitter," *Phys. Rev.* B 20(2), 624–627 (1979); J. van der Weide and R. J. Nemanich, "Argon and Hydrogen Plasma Interactions on Diamond (111) Surfaces: Electronic States and Structure," *Appl. Phys. Lett.* 62(16) 1878–1880 (1993)). This NEA is an intrinsic property of natural diamond and does not require a Cs coating. Additionally, polycrystalline diamond films made by CVD have also been shown to exhibit a discontinuous NEA in the range of 5 to 10 MV/m. A nanocrystalline composite material consisting of about 80% diamond-like structure and about 20% graphite, has been demonstrated to emit electrons. This material is claimed to provide a current density of 0.1 to 1 mA/mm$^2$ with an applied electrical field of 20 to 40 volts per micron at a 4 to 8 mm gap distance. An important property for devices using electron emission is the ability to have continuous emissions from all regions of the substrate. The CVD produced polycrystalline diamond and the nanocrystalline composite material identified above do not exhibit electron emission from all regions of the film i.e. the electron emissions is discontinuous. Continuity of the emission is measured by placing a probe, such as a 100 μm tungsten rod, at a fixed distance from numerous points on an emitting surface, measuring the electron emission and plotting the FN curve, sustantially the same value being obtained for each measured point.

In the past, diamond films have been prepared under a wide range of pressures using chemical vapor deposition techniques (CVD), plasma assisted chemical vapor deposition (PACVD), physical vapor deposition (PVD) and laser induced vaporization.

Diamond is a wide band gap material (Diamond=5.45 eV; silicon is 1.12 eV) with a high resistivity of $10^{16}$ Ωcm. Because these materials have a high breakdown voltage they are useful as insulators for semiconductor applications. Diamond Schottky devices can operate reliably at temperatures up to 700° C. as compared to 150° C. for conventional silicon devices. Additionally, because of the high thermal conductivity of diamond films ($\geq 6.50$ W/cmK) these materials are excellent heat sinks. Diamond also has a smaller thermal expansion coefficient (1–1.5 ppm) than silicon (2.6 ppm) or GaAs (5.9 ppm).

Doped diamond films have been shown to have different electrical properties than diamond films. Diffusion and ion implantation processes have been tried to produce diamond films doped with boron, lithium, potassium, arsenic, antimony, carbon, krypton and xenon.

However, current processes for the production of doped diamond films have not demonstrated formation of films with the desired electron emission characteristics. Further, it has not been demonstrated that diamond films or doped diamond films can be produced covering large areas as would be required in flat screen displays.

Thus there is a need for large area diamond films for large displays which, when used in conjunction with a phosphor screen, produces a continuous, bright display without uniluminated portions in the display.

SUMMARY

These needs are met by the present invention which comprises diamond films with crystal and surface structure which require a very low applied energy to emit electrons. These films are readily applied to large surfaces and provide a uniformity of electron emission not demonstrated by prior produced diamond or diamond like films. The technique for producing these films, referred as PECT (plasma enhanced chemical transport), comprises a simple, versatile and low cost chemical transport process which is enhanced by a hydrogen plasma for formation of microcrystalline diamond films and doped diamond films at a relatively low deposition temperature and a rate of about 1 μm/hr. The doped and undoped materials have unique electrical properties and therefore find potential application as high power density cathodes for large area displays. Because of the easy of electron emission, a diamond cathode ray tube which would be formed from the material of the invention would operate at one-fifth or better of the current density required by conventional thermionic or hot cathode devices and thus would provide a cooler, more powerful cathode ray tube, vacuum tube amplifier and cathodes for large area displays.

The PECT process, performed at 80 to 180 Torr and a current density of about 1 amp/cm$^2$ of substrate, is not limited by the size of the substrate and can be scaled to deposit films on large areas. The technique produces undoped and doped diamond films of a cauliflower and polycrystalline morphologies.

DRAWINGS

The file of this patent contains at least one drawing executed in color. Copies of this patent with color drawing(s) will be provided by the Patent and Trademark Office upon request and payment of the necessary fee.

These and other features, aspects and advantages of the present invention will become better understood with reference to the following description, appended claims, and accompanying drawings, where:

FIG. 8 is an SEM photomicrograph of a cauliflower (nanocrystalline) morphology diamond film.

DESCRIPTION

It has been found that a continuous microcrystalline diamond film comparable or superior to that formed by CVD or laser vaporization techniques can be deposited on a substrate by using a new process, entitled plasma enhanced chemical transport (PECT), which uses a hydrogen plasma generated between solid carbon sources and an anode. The system is easy to use and, contrary to the prior art techniques, does not require a continuous feed of precursor materials, such as a hydrocarbon gas. The process transports carbon from a cathode comprising a graphite rod, pyrolitic carbon, carbon cloth or other suitable sources of carbon to a substrate, either located on a carbon anode or floating near the anode, spaced from about 0.4 to about 1.0 cm away. The cathode and the anode and/or substrate serve as the electrodes for the generation of the hydrogen plasma (glow discharge). While a stable plasma can be formed at 60 to 300 Torr, the preferred operating range for the formation of the nanocrystalline and microcrystalline diamond films is a pressure range of 80 to 180 Torr under a pure hydrogen atmosphere without any added oxygen.

It has further been found that the system can be used to produce several different kinds of diamond films. These diamond films have a different morphology depending on the operating conditions, as discussed below, that are used. In particular, the system can be used to produce microcrystalline well-faceted diamond film, polycrystalline film or nanocrystalline film, and various versions therebetween. The microstructure of these films appear to be similar to diamond films produced by other processes. However, they have unique properties not demonstrated by films having similar microstructure produced by other techniques described in the prior art. In particular, polycrystalline films and nanocrystalline films produced using the PECT techniques and systems described herein have electron emission characteristics superior to that demonstrated by diamond films prepared by other techniques, including diamond films having similar microstructure. A particular feature of PECT produced monocrystalline polycrystalline diamond films is that the electron emission is uniform over the entire surface area of the film in contrast to discontinuous electron emission of films produced by other techniques.

Figure 1:
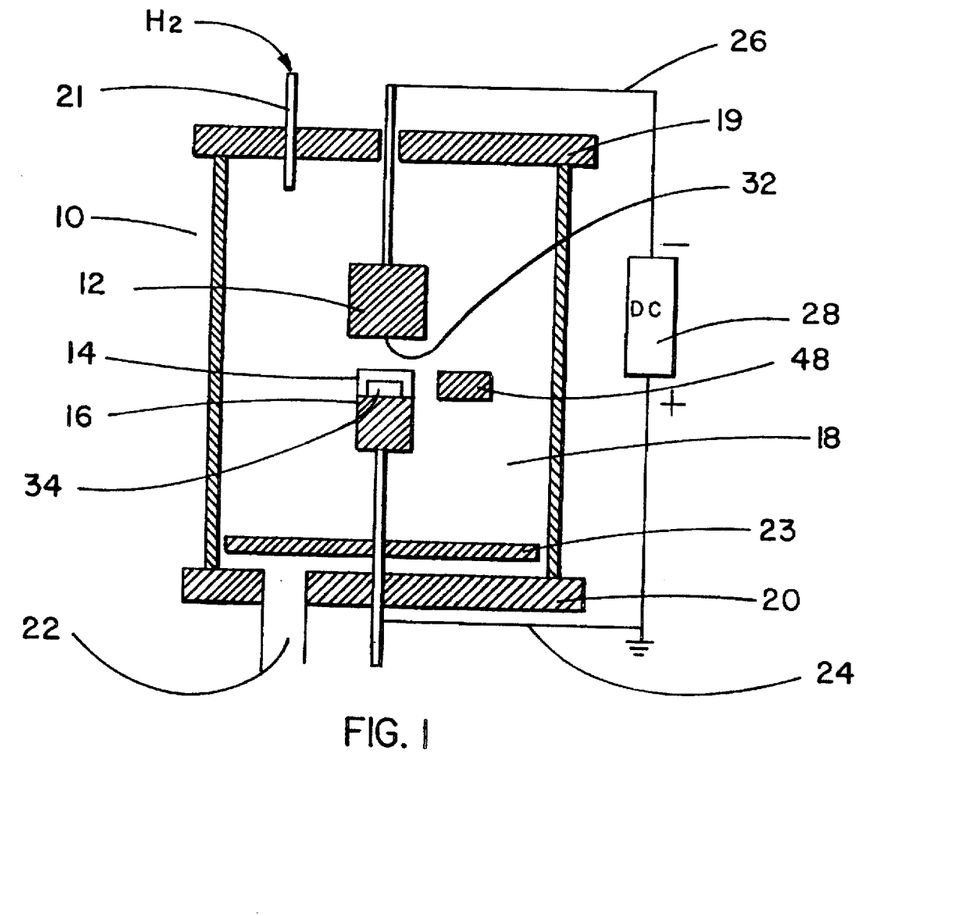
FIG. 1 is a schematic drawing of a diamond film production setup.

FIG. 1 is a schematic drawing of the system 10 used to produce the diamond films of the invention. A carbon cathode 12 is spaced from the substrate 14 placed on an anode 16. The cathode 12 and anode 16 are enclosed in a chamber 18, such as a Pyrex bell jar, which has a gas inlet line 21 and a vacuum outlet 22, each of which may be valved (not shown) to seal the chamber 18 when the desired vacuum is obtained. The top of the chamber 18 is an electrically floating metal plate 19 and the bottom is a plate 20 grounded with the anode 16. Sealed in the wall of the chamber 18 in an airtight manner are positive and negative electrode leads 24, 26 which are connected to a DC sputtering power supply 28 using appropriate feedthroughs. Under these conditions carbon is released from the cathode by chemical sputtering. Chemical Sputtering involves the formation of hydrocarbon species on the cathode surface followed by their release from the surface by thermal desorption and/or momentum transfer. Positioned between the anode 16 and the grounded plate 20 is a Pyrex shield 23 to prevent the ground plate 20 from "seeing" the cathode 12 and forming a glow discharge at the ground plate 20. A separate negatively biased filament (not shown) can be positioned in the chamber between the cathode 12 and the anode 16 or other external electron or plasma sources, such as an r.f. coil, commonly used to ignite the plasma, can be used to start the discharge 31 at the electrode faces. However, it has been found that the plasma in the system as described can be ignited by the high voltage circuit in the dc power source and an extraneous ignition means is not necessary. Also RF or AC power supplies could be used in place of the DC power supply.

Typical operating conditions are 350 to 470 volts DC at a current of about 0.85 to about 1.2 amps and a pressure of about 80 to 180 Torr in a hydrogen atmosphere. Suitable substrates 14 are divided into three classes: a) lattice matched, chemically compatible materials such as diamond or cubic-BN; b) carbides and carbide forming materials such as Si, Ge, Mo, Ta, W; c) other compounds such as oxides and nitrides, i.e., $Al_2O_3$ and $Si_3N_4$; or d) metals such as Au, Pt, Ni, or Cu. A particular advantage of the PECT process is that a polycrystalline diamond film prepared by other processes or a single crystal substrate, such as natural or synthetic single diamond crystal, can be readily coated with a doped diamond material, thus changing the surface properties of the diamond.

Substrate pretreatments are generally provided to generate nucleation sites. These include polishing with diamond paste or depositing another coating on the surface prior to diamond deposition. High quality diamond films have been produced at a rate of about 1 micrometer per hour using a cathode 12 having a lower face 32 diameter of about 2.5 cm and an anode 16 or substrate with an upper face 34 diameter of about 0.95 cm, the cathode lower face 32 and the anode/substrate upper face 34 being spaced about 0.6 cm apart. The preferred current density, based on the area of the anode upper face 34 is 1 amp/cm$^2$ which is obtained when the voltage is 450 V DC and the current is 1.1 amp. However, it has been found that suitable microcrystalline diamond films can be obtained under conditions which vary from the preferred. For example, at higher pressures the current and voltage can be reduced (i.e., 120 Torr, 0.9 amp & 420V). The discharge current and voltage has also been found to vary with the gas pressure and gas temperature. The current delivered to the cathode 12, and, therefore, the size of the substrate 14 is limited at present by the 2.5 kw power source 28 available to the inventor. It is expected that the power delivered to the system can be increased by use of a higher capacity power supply without any detrimental effect. It is not believed that the maximum preferred current set forth above or the ratio of anode/substrate to cathode surface area is a critical or a limiting factor as long as the current density is maintained in the range of about 0.5 to about 4.0 amp/cm$^2$, with the preferred current density being at about 1 amp/cm$^2$. It is also preferred that the area of the anode/substrate is sufficiently less than the cathode area to keep the potential of the anode/substrate positive with respect to the plasma potential resulting in electron bombardment of the anode/substrate, the said electron bombardment being very useful in the formation of the diamond film.

In order to add a dopant 50 to the diamond film during its formation several techniques have been developed to introduce a solid source of dopant 50 atoms into the plasma 31.

Figure 2:
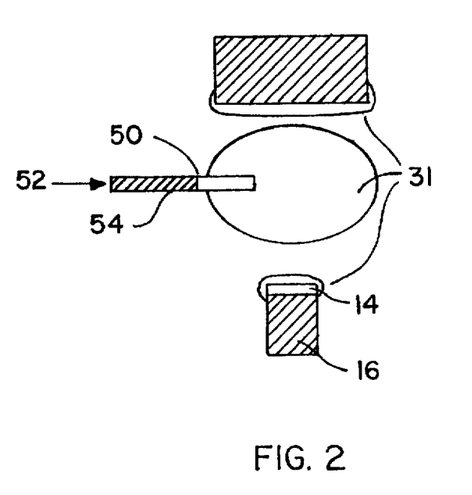
FIG. 2 is a first embodiment of a electrode and dopant source for forming a doped diamond film.

FIG. 2 shows a plasma heated source rod 52 surrounded by a tungsten coil 54. The tungsten coil 54 and the dopant are heated by the electrons, ions and neutral particles in the plasma 31. The dopant 50 is vaporized and transported with the carbon to the substrate 14. Suitable solid dopant sources are LiH, NaH, NaCl, $Na_2CO_3$, $P_2O_3$, $B_2O_3$, B and $B_4C$.

Figure 3:
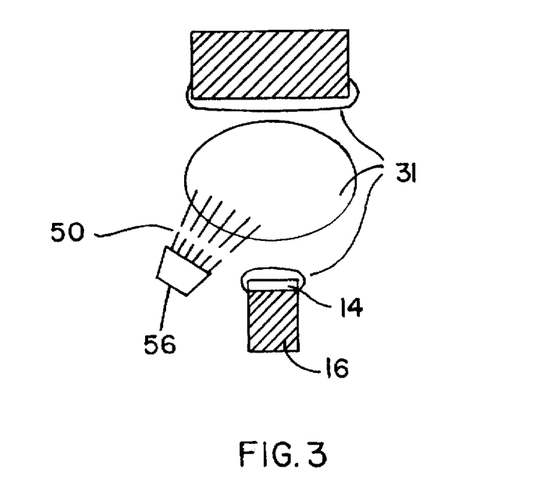
FIG. 3 is a second embodiment of a electrode and dopant source for forming a doped diamond film.

A second arrangement, shown in FIG. 3, utilizes a dopant material 50 which is vaporized from a crucible 56 located adjacent to the plasma 31 centered between the cathode 12 and anode 16.

Figure 4:
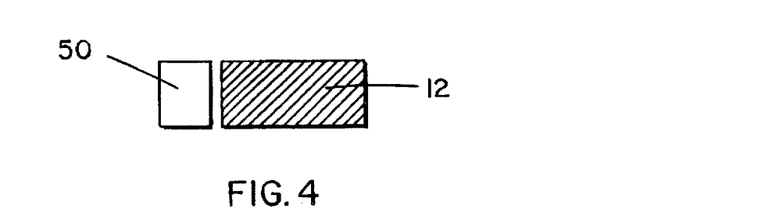
FIG. 4 is a first embodiment of a cathode arrangement for delivery of a dopant.
Figure 5:
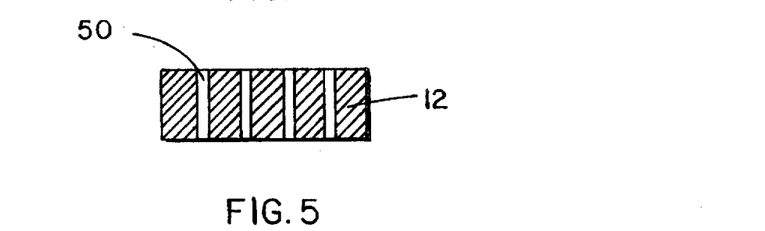
FIG. 5 is a second embodiment of a cathode arrangement for delivery of a dopant.
Figure 6:
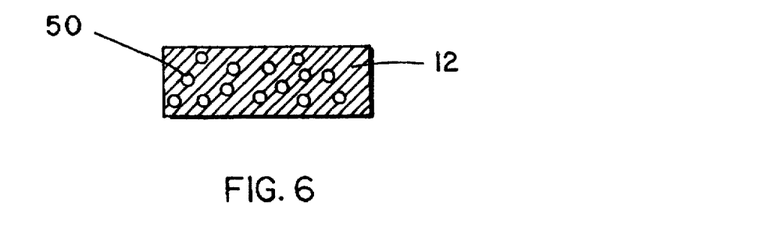
FIG. 6 is a third embodiment of a cathode arrangement for delivery of a dopant.

A third process is to sputter the dopant 50 along with the carbon by using a cathode 12 which incorporates the dopant 50 either in a second target 60 next to the carbon electrode 12 (FIG. 4), a single electrode having alternate layers of carbon and dopant 50 (FIG. 5) or a cathode 12 which incorporates the dopant 50 dispersed throughout the carbon cathode (FIG. 6). The structures shown in FIGS. 4, 5 and 6 have the added advantage that the ratio of dopant to carbon can be controlled in a desired range by preselecting the amount of dopant combined with the carbon in the cathode.

Figure 7:
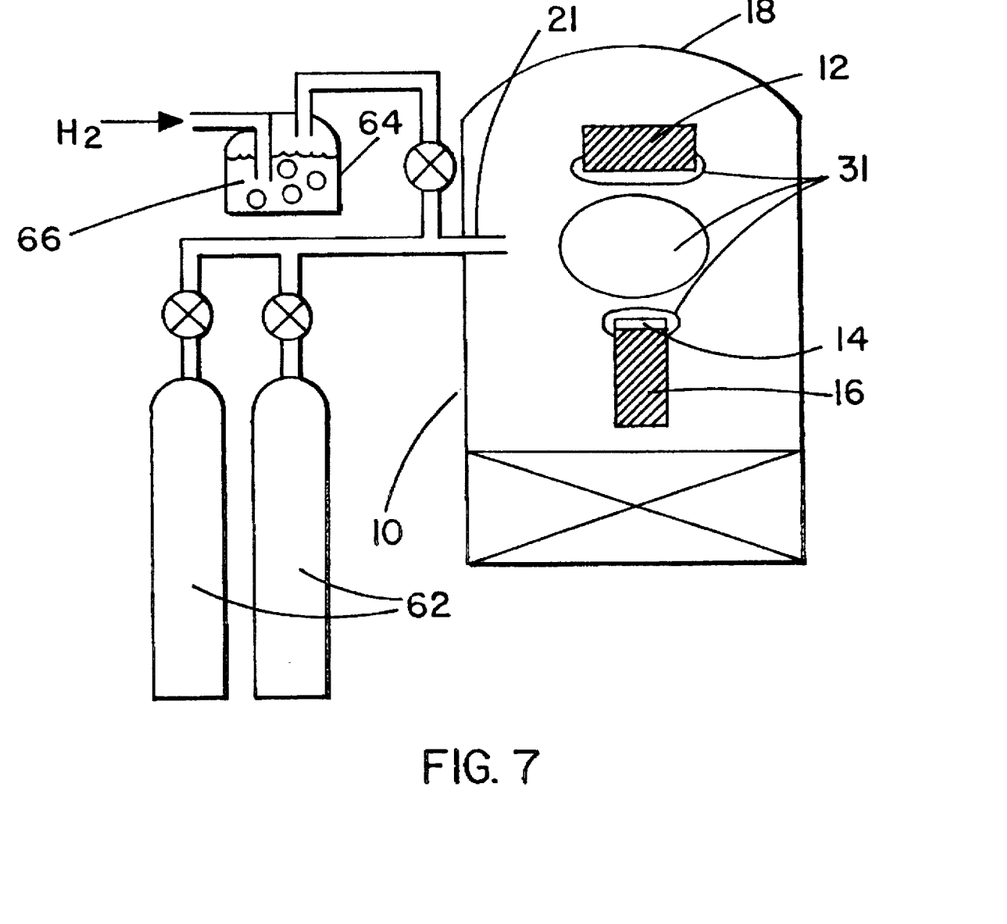
FIG. 7 is a schematic drawing of a doped carbon film production setup using a gaseous dopant compound.

It is also contemplated that gaseous dopant sources, such as used in CVD, MOCVD (metal organic chemical vapor deposition) or MBE (Molecular Beam Epitaxy) can be used. FIG. 7 shows a set up which allows dopant 50 containing reactant gases to be delivered from tanks 62 to a reaction vessel 64. The carrier gas (hydrogen) is then bubbled through the dopant mixture 66 and introduced into the plasma 31 in the deposition chamber 18. Examples of suitable gases are $BCl_3$, $PCl_3$, $(CH_3)PCl_2$, $CH_3Li$ and $C_4H_9Li$.

All four setups described above and shown in FIGS. 2–7 are usable to add dopants to the growing diamond film. The resistivity of the resultant film can then be measured by the use of a four point probe.

In order to operate the system 10, a substrate 14 is placed on the anode 16, the chamber 18 is closed, the atmosphere in the chamber 18 is evacuated down to about 20 mTorr, flushed with hydrogen and then brought to the desired operating pressure. The system 10 can then be sealed and operated in a static mode. Alternatively, flowing hydrogen either intermittently or continuously through the chamber during deposition while maintaining the desired pressure or pressure range, can improve somewhat the quality of the film formed.

The system and conditions described above generate continuous microcrystalline diamond films with a clear Raman spectra having a peak at about 1334 cm$^{-1}$ characteristic of crystalline diamond (non-diamond carbon shows a peak at 1580 cm$^{-1}$) and an X-ray spectra typical of crystalline diamond. SEM photomicrographs show diamond films with faceted (polycrystalline) morphology, multiple twin faceted morphology or cauliflower (nanocrystalline) morphology, depending on operating conditions. The continuous diamond films show (111) or (220) preferred orientations depending on the disposition parameters.

Figure 10:
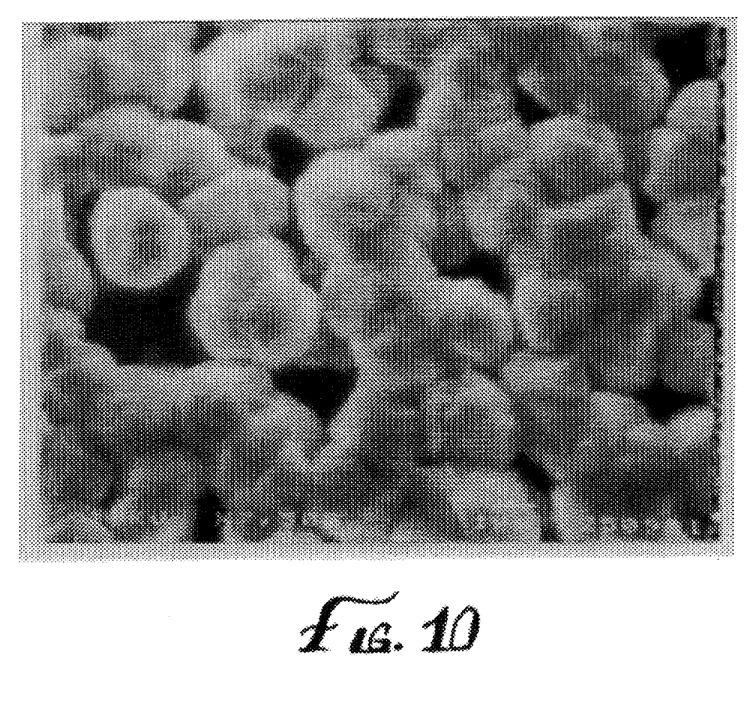
FIG. 10 is an SEM photomicrograph of a polycrystalline diamond film.

FIGS. 8 and 10 show diamond films which have an improved electron emission (over the prior art) prepared using the PECT process. A multifaceted, polycrystalline diamond film, characterized by a greater amount of sp$^3$ bonds, is shown in FIG. 10. FIG. 8 shows a different diamond film morphology referred to as a cauliflower or nanocrystalline morphology. Both were prepared on a pre-scratched silicon surface but under different operating conditions. The multifaceted film of FIG. 10 was deposited at 100 Torr in flowing hydrogen at 30 sccm, with 1.1 A and a 435V discharge. The film shows well-faceted multiple twinned micro-crystals with a Raman peak at 1334 cm$^{-1}$, an FWHM of 7.9 cm$^{-1}$, and a low amorphous carbon signal. The X-ray pattern shows a (111) diamond peak of high intensity as well as very distinct (220) and (311) peaks. This film has a higher diamond content, and therefore a somewhat improved quality over films Obtained under the same operating conditions in a static flow system. The cauliflower morphology of FIG. 8 was produced at the same pressure but at a lower current density (0.8 Amp). The multifaceted and cauliflower morphology shown appears to resemble CVD diamond coatings obtained at low and high hydrocarbon levels in the $H_2$/hydrocarbon mixtures commonly used in CVD processes, respectively. However, the properties of the films produced by the PECT process are different from and superior to the similarly appearing CVD produced films. The Raman spectra for the multifaceted diamond film, as well as the cauliflower morphology, shows a peak at 1334–1335 $cm^{-1}$ and some amorphous carbon background at 1550 $cm^{-1}$. The full width at half-maximum (FWHM) of the diamond Raman peak was 10.8 $cm^{-1}$.

The different morphologies can also be prepared by holding the power in the electrical discharge fixed, for example at 400±10 watts, while varying the pressure in the chamber. At 70 Torr a cauliflower nanocrystalline morphology similar to FIG. 8 is obtained. A faceted morphology was obtained at 100 Torr and the multi-faceted polycrystalline morphology was produced at 180 Torr.

It was also found that the growth of the diamond film is not self limiting. At 100 Torr in hydrogen and 1.1 amp at 420±20 V DC the growth rate was 1 μm/hr with 5.5 μm thickness deposited in 6 hours and 11 μm thickness in 10 hours.

EXAMPLE 1

Two graphite rods (Unocal Poco graphite), 2.5 cm and 1 cm in diameter respectively, were installed vertically in a 30 cm diameter Pyrex cylinder 46 cm long, the larger diameter rod being the cathode and the smaller being the anode. With the tips of the rods spaced 0.6 cm apart substrates with various surface treatments were attached to the anode using colloidal silver or colloidal graphite paste. An electrically insulated vacuum feed-through was used to connect the cathode to an RF Plasma Products SPS 5000 dc power source. A mechanical pump was used to reduce the pressure of the chamber to $2.66 \times 10^{-2}$ mbar (20 mTorr). The system was then backfilled to 100 Torr using 99.999% hydrogen, pumped down to 100 mTorr three times, and then hydrogen was bled into the system until 100 Torr pressure was reached and the flow was terminated. A hydrogen plasma was initiated between the anode and cathode by the high voltage circuit in the power supply. The cathode surface temperature was measured by an optical pyrometer to be about 950° C. and the anode/substrate surface temperature was measured to be about 700°–850° C. by a thermocouple. The carbon was transported from the cathode to the anode/substrate. The discharge voltage and current were 450 V dc and 1.1 amp respectively. It was found that diamond films could be deposited on silicon, magnesium oxide, copper and graphite substrates. The films generated were analyzed by micro-Raman spectroscopy, X-ray diffraction and SEM. The nucleation density of diamond on bare silicon and silicon surfaces coated with diamond-like carbon, fullerene-rich soot, silicon carbide or magnesium oxide, observed by SEM photomicrographs are listed in Table 1.

TABLE 1

Diamond nucleation density on silicon substrates

| Type of substrate | Nucleation density #/cm² | |
|---|---|---|
| | PECT | PRIOR ART |
| Bare silicon (100) | $10^6$–$10^7$ | $10^4$–$10^6$ |
| Diamond powder polished silicon | $10^7$–$10^8$ | $10^6$–$10^8$ |
| Fullerene-riched soot coated silicon | $1 \times 10^9$ | |
| Diamondlike carbon coated silicon | $3.9 \times 10^8$ | |
| Silicone carbide coated silicon | $1.8 \times 10^8$ | |
| Magnesium oxide coated silicon | $7 \times 10^8$ | |

It has also been found that a diamond film can be deposited on surfaces other than the substrate 14 mounted on the anode 16. For example, a floating substrate 48 positioned between and beside the space between the anode 16 and cathode 12 becomes coated with a diamond film.

The process as described above can also be adapted, as described below, to add a dopant to the diamond film during its formation. The addition of the dopant changes the properties of the film, particularly the physical and electrical characteristics, allowing the doped diamond film to be used for additional applications. For example, doped diamond films are useful as semiconductors of both the p-type and n-type and boron doped materials have a high electron emission.

Boron doped diamond films prepared using the arrangement shown in FIG. 1, depending on specific operating conditions, formed p-type semi-conductors exhibiting resistivities ranging from $10^{-2}$ to $10^4$ Ωcm, sodium doped films showed resistivity values of $10^3$ to $10^5$ Ωcm and lithium doped films demonstrated n-type semiconductor properties with resistivities from 2.7 to $10^3$ Ωcm.

Undoped diamond is an insulator having a wide band gap of 5.4 eV. Thus electrons do not flow freely from its surface. Once electrons are lost into a vacuum the surface of the diamond becomes positively charged, prohibiting subsequent electron emission. However, it has been found that the conductivity of the film can be enhanced by adding a dopant such as boron with the resultant diamond film exhibiting p-type semiconducting behavior.

Alternatively, it has been found that conductivity can be enhanced by producing a mixed phase in which nanocrystalline diamond coexists with another conducting phase. A unique property of the cauliflower-like diamond is its low resistivity. A doped, nanocrystalline diamond has a further improved conductivity, an enhanced electron emission diamond surface and a dramatically increased field emission efficiency which is continuous across the surface of the film.

Figure 11:
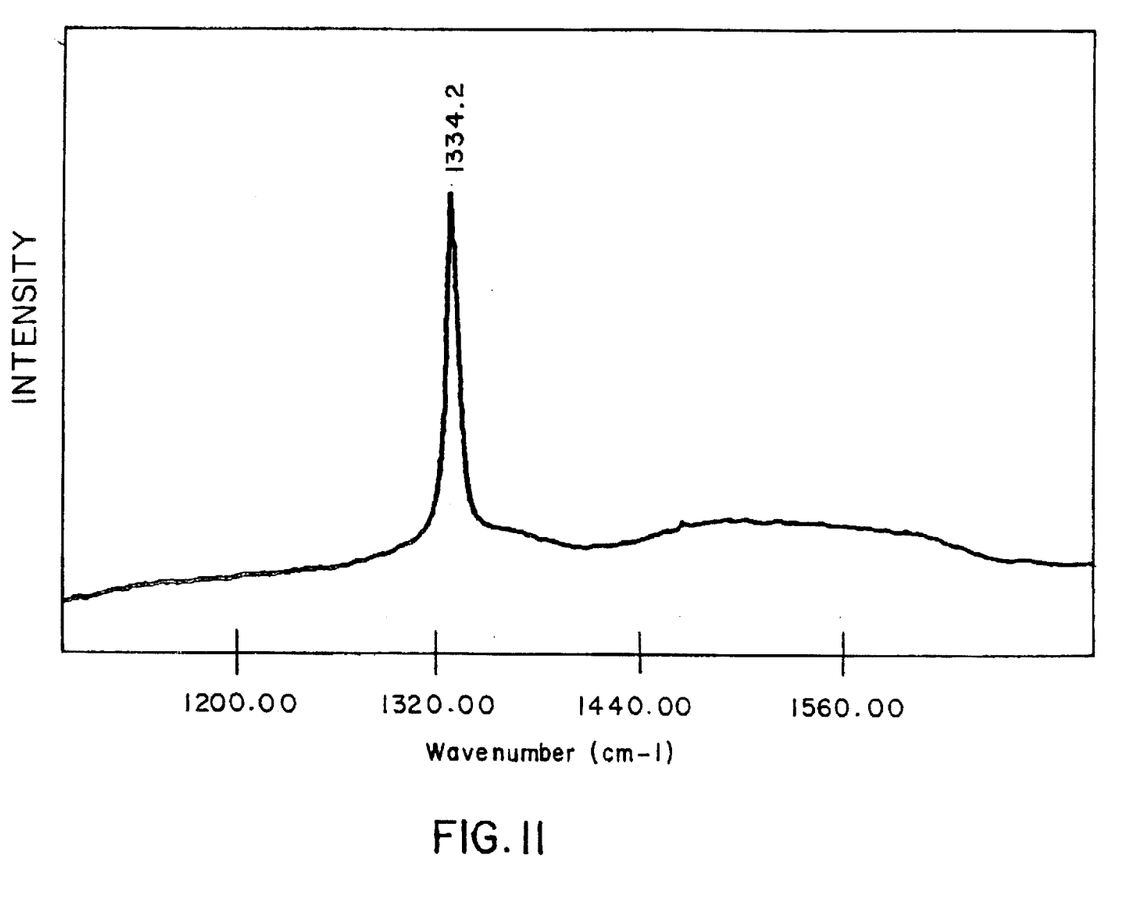
FIG. 11 is a graph showing the Raman spectra for the diamond film of FIG. 10.

FIG. 11 is the Raman spectra of a boron doped polycrystalline diamond film. This spectra is substantially the same as a film prepared under similar conditions without the dopant. As indicated by the low background in the spectra, the films lack a non-diamond phase such as graphite or amorphous carbon.

Figure 9:
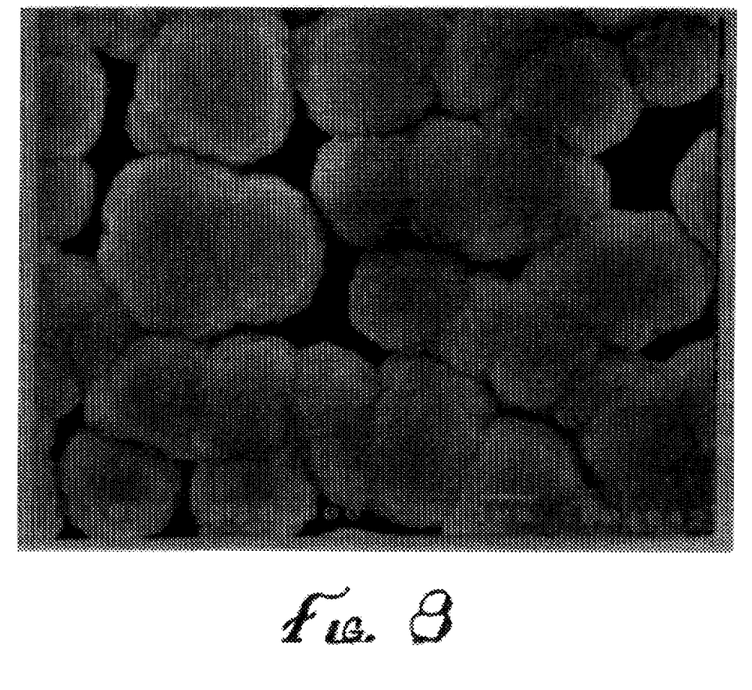
FIG. 9 is a graph showing the Raman spectra for the diamond film of FIG. 8.

FIG. 9 shows the Raman spectra of a nanocrystalline (cauliflower) diamond film. The peaks at 1140, 1332, 1349 and 1476 $CM^{-1}$ are typical of diamond crystallites having sizes below 20 nm. The background in the spectra which peaks at 1521 $CM^{-1}$ is believed to be caused by an ill-defined carbon phase which fills the regions between the diamond crystallites.

Figure 12:
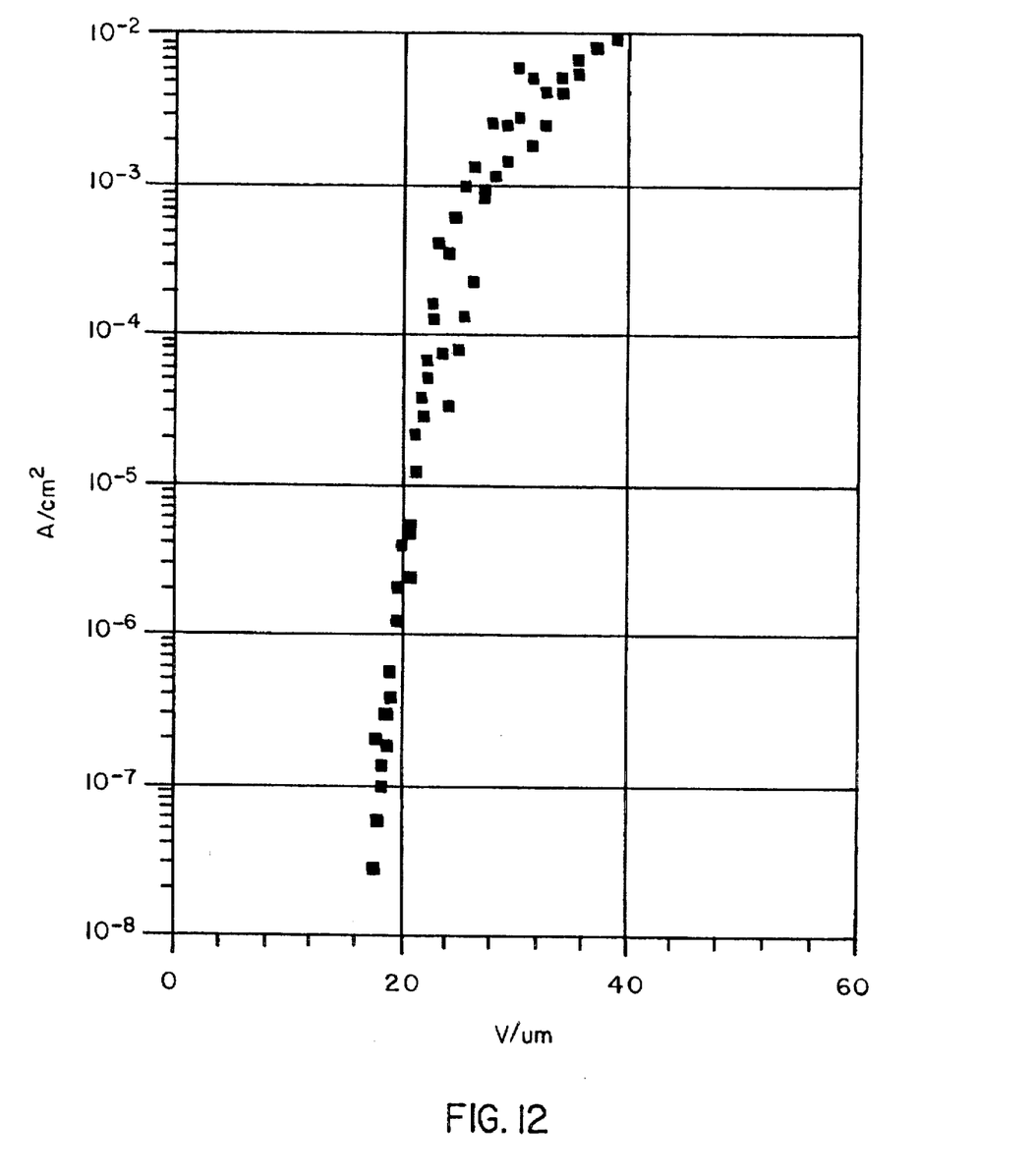
FIG. 12 is a graph showing the I–V characteristics of a boron doped film having the polycrystalline structure shown in FIG. 10.
Figure 13:
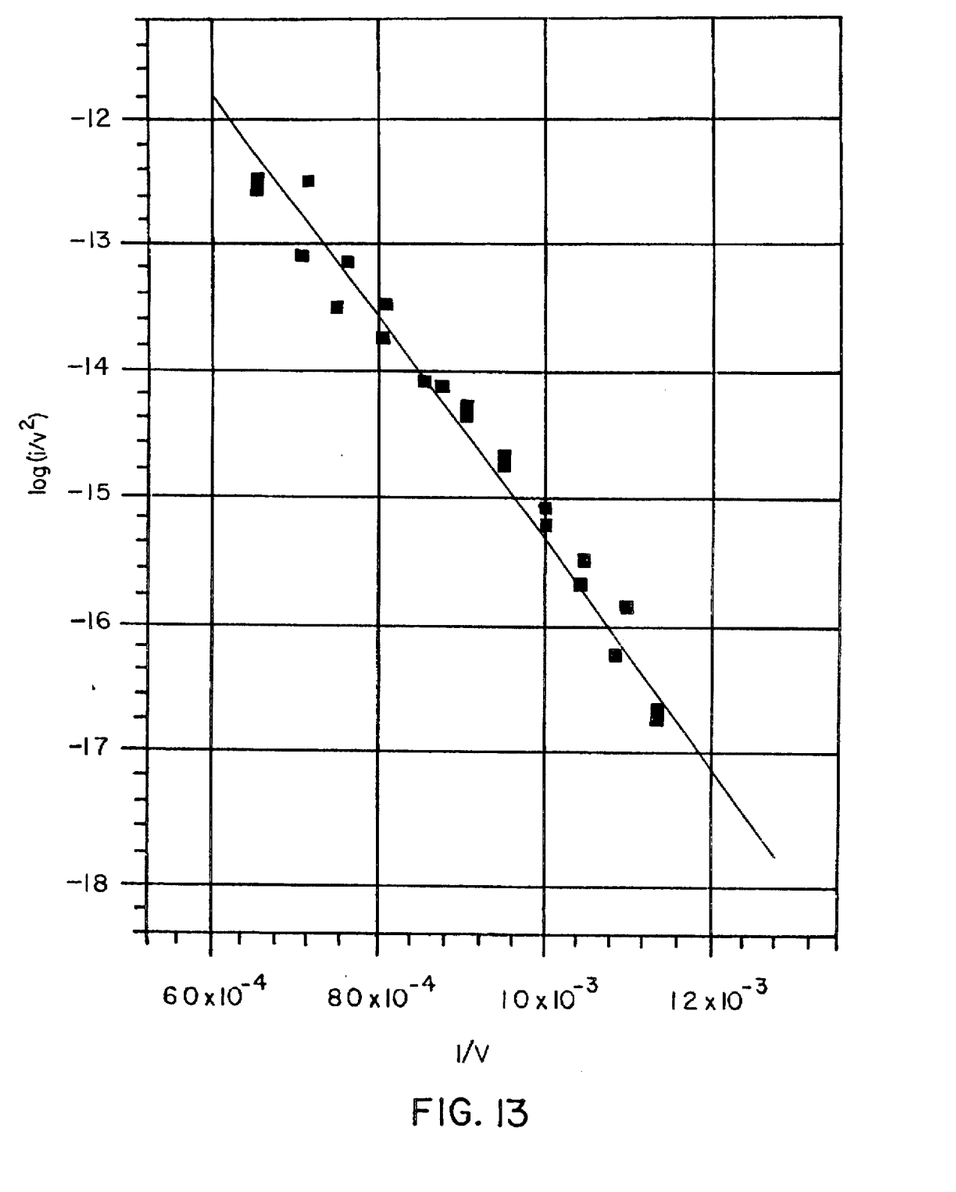
FIG. 13 is a graph showing the Fowler-Nordheim curve for a boron doped film having the polycrystalline structure shown in FIG. 10.

The electron emission efficiency of a material is characterized by plotting the emission current (A/cm²) versus the anode voltage (V/μm), i.e. the I–V curve. The Fowler-Nordheim (FN) curve is then derived by plotting $I/V^2$ vs I/V. A linear relationship in the FN curve indicates a material with cold field emission (room temperature) properties. Further, the slope of the FN curve is an indication of how easy electrons are released from the surface of the materials, the more shallow the slope of the FN curve, (i.e. closer to horizontal), the easier it is to release electrons. FIG. 12 shows the I–V relationship for the boron doped film of FIG. 10 and 11. The field required to create emission is between 18 and 20 V/μm. This value is comparable with doped polycrystalline material produced by CVD. However, the CVD process has been unable to produce a film with continuous emission properties. In contrast thereto, doped polycrystalline material produced by the PECT process has consistent and continuous emission properties.

Figure 14:
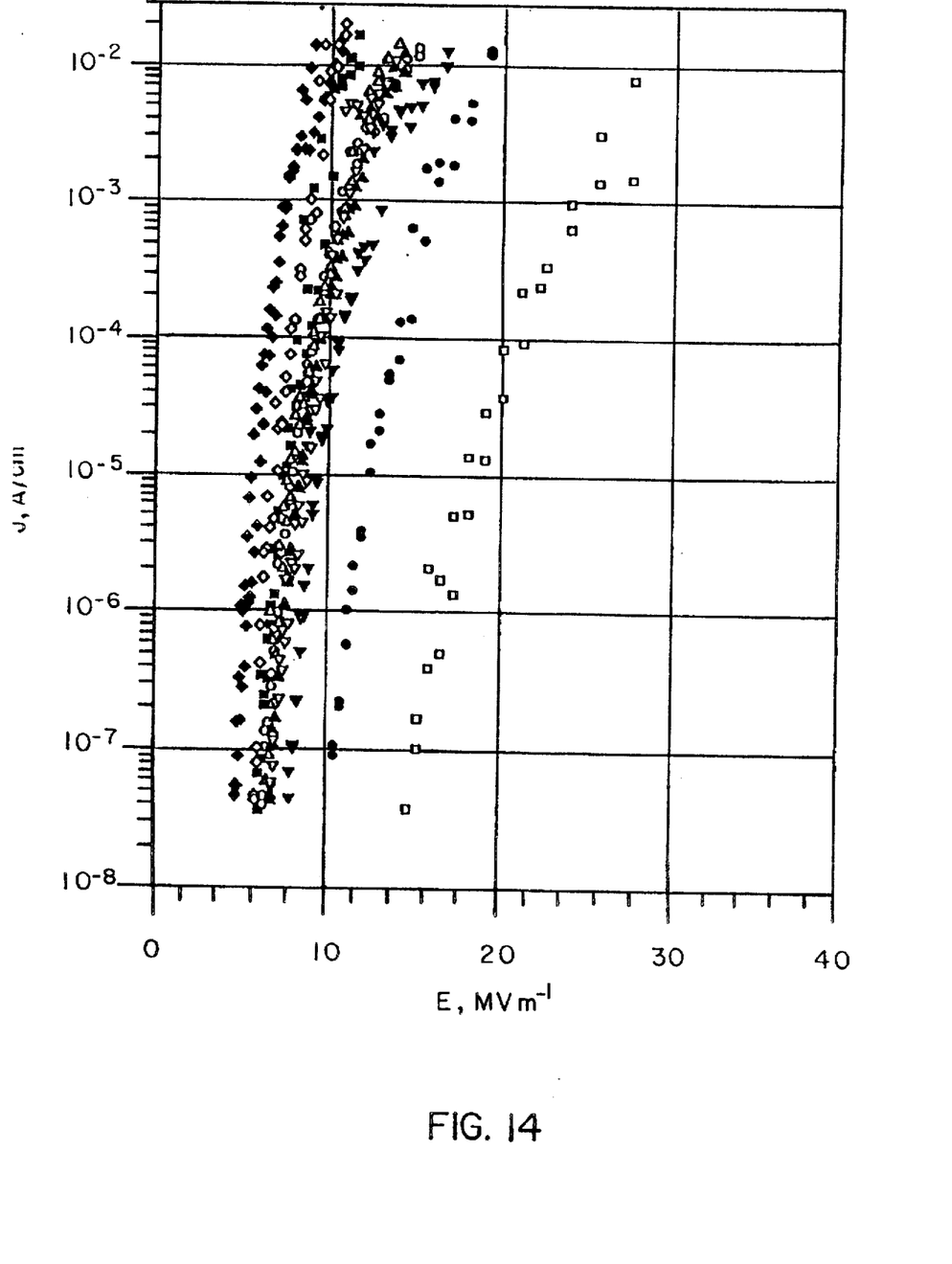
FIG. 14 is a graph showing the I–V characteristics of the nanocrystalline films of FIG. 8.
Figure 15:
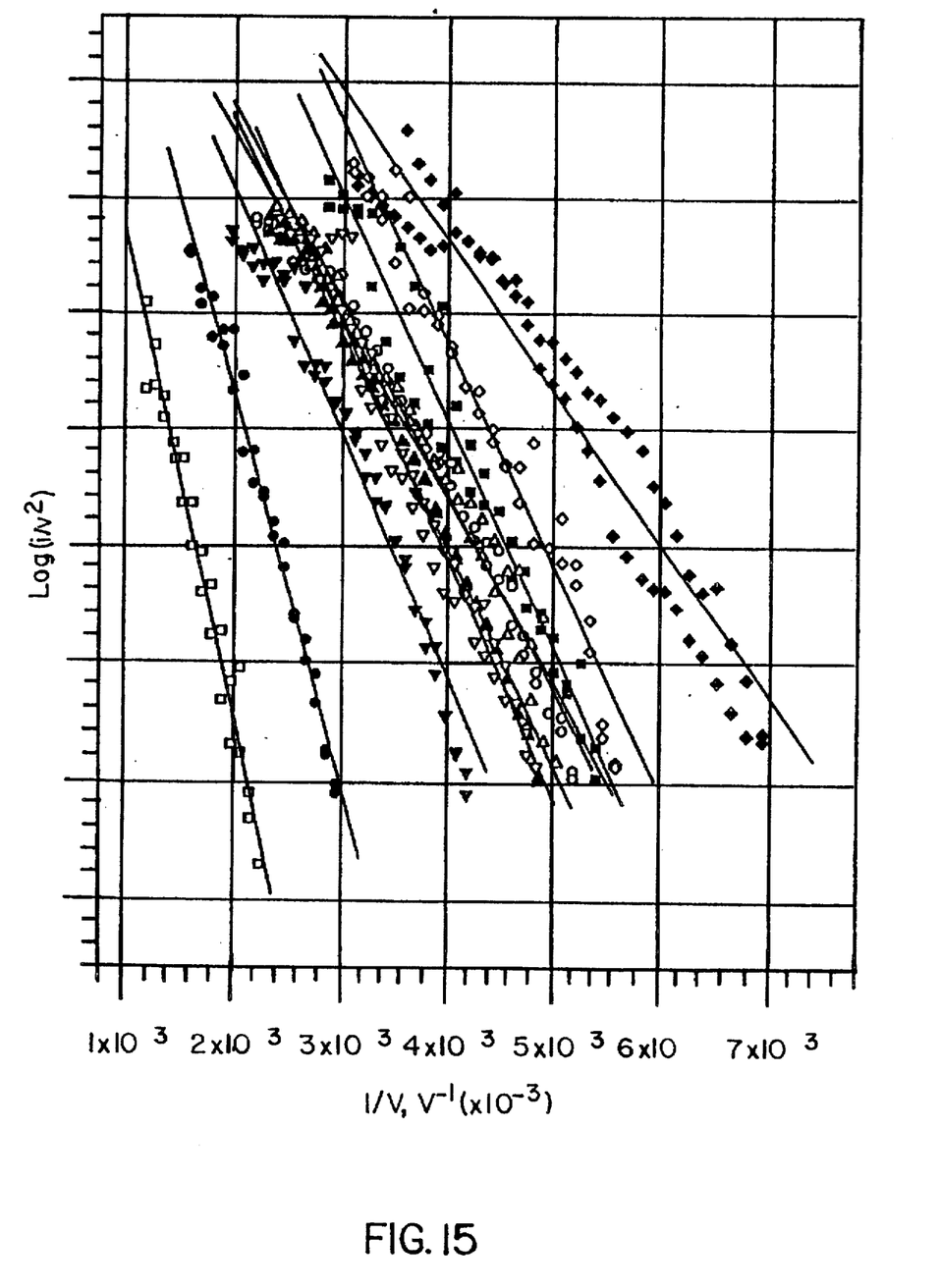
FIG. 15 is a graph showing the Fowler-Nordheim curve for the nanocrystalline film of FIG. 8.

FIG. 14 shows the I–V curves for various undoped nanocrystalline diamond films prepared by the PECT process. The threshold emission field for these materials generally run from about 5 to about 8 volts but may be as high as about 14 volts/μm. The FN graphs of these materials clearly indicate that they have cold field emission properties.

Based on the results obtained it is expected that a doped, nanocrystalline diamond film produced using the PECT process with boron added as a dopant will have cold field emission with a threshold emission field less than 3 V/μm which is lower than the undoped version as shown on FIG. 14. Also a doped version would appear on the FN curve further to the right then its undoped version and would have a shallower slope than the undoped version.

Although the present invention has been described in considerable detail with reference to certain preferred versions and uses thereof, other versions and uses are possible. For example, while boron has been disclosed as the preferred dopant, various other elements may be incorporated into the diamond structure to form diamond films with semiconductor properties. However numerous other atoms can behave similarly. Therefore, it is possible that the other atoms in group 3a of the periodic chart (Al, Ga, In, and Tl) would be useful to dope diamond films to form p-type junctions and the other atoms in group 5a of the periodic chart (N, As, Sb, and Bi) would be useful to form n-type junctions. Additionally, the other atoms in group 1a of the periodic chart (Na and Li are discussed above) each have a single outer electron and could behave similarly. In a like manner the atoms in group 3b as well as numerous atoms in the Lanthanide and Actinide series, could behave in a manner similar to those in group 3a since they have 3 outer electrons and those in group 5b could behave in a manner similar to those in group 5a. Additionally, it is not necessary that the resultant diamond film have a single dopant. The process is amenable to delivering more than one dopant atom at a time and combinations of dopant materials can result in unique and previously unknown materials and properties.

Besides use as electron emitters, diamond films doped with various different atoms can also exhibit other unique electrical, magnetic, optical and physical properties. It is contemplated that certain dopants may result in the formation of superconducting materials. Also, because diamonds containing various different atoms, usually referred to as impurities, can have different colors as a result of the inclusions, it is also contemplated that the processes disclosed herein are useful for preparing various unique appearing materials for decorative and jewelry purposes or as crystals for use in laser systems. Therefore, the processes described herein to produce doped materials are not limited to that application but are contemplated to be useful for producing a broad range of diamond based films which have various unique applications. Additionally, the PECT process is not limited to the production of a continuous diamond film. Powdered or single crystal pure or doped diamonds can be obtained by removing the partially coated substrate from the plasma and separating the coating from the substrate before a continuous film is formed.

Also, as indicated above, while preferred operating conditions and dimensions of the equipment have been described, the invention should not be considered to be limited by those operating parameters, the critical parameters being the pressure, the presence of a hydrogen plasma and the current density. Therefore, the spirit and scope of the appended claims should not be limited to the description of the preferred versions contained herein.

What is claimed is:

1. A polycrystalline diamond film doped with boron, said film being suitable for use as a cold field electron emitter and having a threshold emission field of less than 18 V/μm, said emission property being continuous across the surface of the film.

2. A nanocrystalline diamond film, said film being suitable for use as a cold field electron emitter and having a threshold emission of from about 3 to about 14 V/μm, said emission property being continuous across the surface of the film.

3. The nanocrystalline diamond film of claim 2 further being doped with boron and having a threshold emission field of less than 14 V/μm.

4. The nanocrystalline diamond film of claim 2 further being doped with boron and having a threshold emission of less than 8 V/μm.

5. The nanocrystalline diamond film of claim 1 further being doped with boron and having a threshold emission of less than 3 V/μm.

6. A process for producing a diamond film having a negative electron affinity with a cold cathode threshold emission field of less than about 18 V/μm, said process being a plasma enhanced chemical transport process for the formation of a diamond film on a substrate, the substrate being located on or near an anode in a dc circuit, the substrate being spaced from a carbon cathode and the anode, substrate and cathode being located within a vacuum chamber comprising:

a.) positioning the substrate at a distance from a lower surface of the cathode to form a gap of from about 0.4 to about 1.0 cm, b.) evacuating substantially all of the gases from the vacuum chamber and then introducing sufficient hydrogen gas into the chamber to bring the pressure in the chamber to the range from about 80 Torr to about 180 Torr, and c) applying a dc current to the circuit and across the gap between the anode and the cathode to form a hydrogen plasma in the gap, the current density at an upper surface of the anode being from about 0.5 to about 4.0 amp/cm$^2$.

7. The process of claim 6 further including the addition of a dopant.

8. The process of claim 7 wherein the dopant is boron.

9. The process of claim 7 wherein the threshold emission field is less than about 3 V/μm.

10. The nanocrystalline diamond film of claim 2 in which the nanocrystalline diamond coexists as a mixed phase with a second conducting carbon phase.

* * * * *